(12) United States Patent
Hahn (10) Patent No.: US 7,821,832 B2
(45) Date of Patent: Oct. 26, 2010

(54) FLASH MEMORY DEVICE HAVING SHARED ROW DECODER

(75) Inventor: Wook-ghee Hahn, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 195 days.

(21) Appl. No.: 12/247,325

(22) Filed: Oct. 8, 2008

(65) Prior Publication Data

US 2009/0257278 A1 Oct. 15, 2009

(30) Foreign Application Priority Data

Apr. 11, 2008 (KR) .................. 10-2008-0033873

(51) Int. Cl.
*G11C 16/04* (2006.01)
(52) U.S. Cl. .................. 365/185.11; 365/185.23; 365/230.03; 365/230.06
(58) Field of Classification Search ............ 365/185.11, 365/185.23, 230.03, 230.06
See application file for complete search history.

(56) References Cited

U.S. PATENT DOCUMENTS 6,282,121 B1 * 8/2001 Cho et al. .............. 365/185.22
7,403,420 B2 * 7/2008 Kim ...................... 365/185.18
7,580,284 B2 * 8/2009 Park et al. .............. 365/185.11
2005/0078517 A1 4/2005 Abedifard

FOREIGN PATENT DOCUMENTS

KR 1020030019042 A 3/2003
KR 100449269 B1 9/2004

* cited by examiner

*Primary Examiner*—Pho M Luu
(74) *Attorney, Agent, or Firm*—Volentine & Whitt, P.L.L.C.

(57) ABSTRACT

A flash memory device includes at least two mats and a row decoder shared by the mats. Each mat includes multiple word lines, bit lines, and blocks that share the bit lines. The row decoder includes a block decoder that generates a block selection signal for selecting a block, a block word line boosting circuit that generates a high voltage block word line signal in response to the block selection signal, a word line driver that drives word line drive signals driving the word lines of the selected block using drive voltages according to an operation mode and the word lines of an unselected block using a first bias voltage, and a string selection line driver that drives a string selection signal of the selected block using a drive voltage according to the operation mode and the string selection signal of the unselected block using a second bias voltage.

28 Claims, 4 Drawing Sheets

FLASH MEMORY DEVICE HAVING SHARED ROW DECODER

CROSS-REFERENCE TO RELATED APPLICATIONS

A claim of priority is made to Korean Patent Application No. 10-2008-0033873, filed on Apr. 11, 2008, in the Korean Intellectual Property Office, the subject matter of which is hereby incorporated by reference.

BACKGROUND

1. Field of the Invention

The present invention relates to a flash memory device, and more particularly, to a flash memory device having a row decoder shared by at least two blocks.

2. Description of the Related Art

Flash memory devices program and erase data using the tunneling phenomenon. Based on advantages of flash memory devices, such as superior data preservation, low power consumption, and strong durability against external shock, flash memory devices are typically suitable as auxiliary memory devices of portable devices. The size of a memory cell of a NAND flash memory device, in which a predetermined number of memory cells are connected in series, is relatively small as compared to that of a NOR flash memory device, in which the memory cells are connected in parallel. Thus, the NAND flash memory device exhibits high integrity, and is generally more useful as a large capacity auxiliary memory device.

In a NAND flash memory device, multiple memory cells serially connected to a single bit line constitute a single string, multiple memory cells connected to a single word line constitute a page. A memory cell array is divided into blocks, each block being formed by multiple pages. In the NAND flash memory configured as described above, a reading operation and a programming operation are performed by the page and an erase operation is performed by the block.

For the large capacity of the NAND flash memory device, mats are arranged. Each mat includes multiple blocks, which share bit lines. For example, referring to FIG. 1, in the layout of NAND flash memory device 100, at least two mats, first mat 10 and second mat 20, are arranged. A first row decoder 12 and a first pass transistor unit 14, and a second row decoder 22 and a second pass transistor unit 24, are respectively arranged close to the first mat 10 and the second mat 20.

Figure 1:
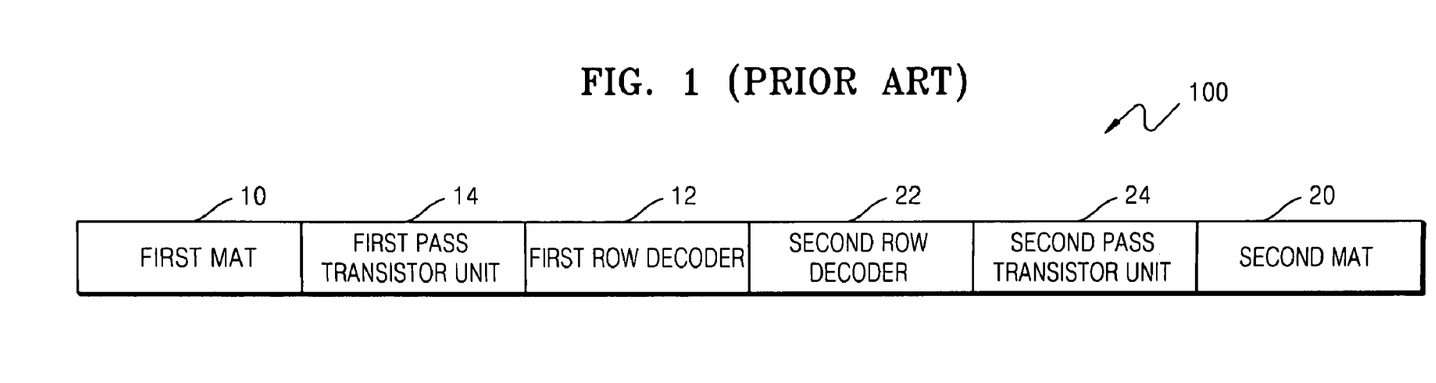
FIG. 1 illustrates a layout of a conventional NAND flash memory device.

Each of the first and second row decoders 12 and 22 selects one of the word lines according to address information, and provides word line voltages to selected and unselected word lines according to the operation mode. For instance, in a program operation mode, each of the first and second row decoders 12 and 22 provides a program voltage Vpgm of about 18 V, for example, to a selected word line and a pass voltage Vpass of about 10 V, for example, to an unselected word line. In a read operation mode, each of the first and second row decoders 12 and 22 provides a ground voltage VSS to a selected word line and a read voltage Vread of about 4.5 V, for example, to the unselected word line. The program voltage Vpgm, the pass voltage Vpass and the read voltage Vread are higher than a power voltage VDD of about 3 V, for example.

To provide a voltage higher than the power voltage VDD to the word lines, the first and second row decoders 12 and 22 include a block word line boosting circuit capable of switching a high voltage. The block word line boosting circuit generates a high voltage block word line signal. Each of the first and second pass transistor units 14 and 24 is turned on in response to a block word line signal provided by the first and second row decoders 12 and 22, and applies the program voltage Vpgm, the pass voltage Vpass, and the read voltage Vread provided by the first and second row decoders 12 and 22 to the selected word line and the unselected word lines of the first and second mats 10 and 20.

As the semiconductor manufacturing process develops, the design rule for the memory cell array in each of the first and second mats 10 and 20 decreases. Accordingly, the layout area of each of the first and second mats 10 and 20 decreases. However, since the layout area of the block word line boosting circuit of each of the first and second row decoders 12 and 22 is relatively large, the layout area of each of the first and second row decoders 12 and 22 is not decreased at the rate at which the layout area of each of the first and second mats 10 and 20 decreases. As a result, the first and second row decoders 12 and 22 restrict reduction of the layout area of the NAND flash memory device 100.

SUMMARY

Various embodiments of the present invention provide a flash memory device having a row decoder shared by blocks in multiple mats, or blocks in the same mat.

According to an aspect of the present invention, a flash memory device includes at least two mats and a row decoder. Each mat includes multiple word lines, multiple bit lines, and multiple blocks that share the bit lines. In each block, multiple memory cells serially connected to one of the bit lines constitute a string, multiple memory cells connected to one of the word lines constitute a page, and multiple pages constitute the block. The row decoder is shared by the blocks of each of the at least two mats, and includes a block decoder, a block word line boosting circuit, a word line driver and a string selection line driver. The block decoder generates a block selection signal in response to a block address signal for selecting a block of the multiple blocks. The block word line boosting circuit generates a high voltage block word line signal in response to the block selection signal. The word line driver drives word line drive signals driving the word lines of the selected block using word line drive voltages according to an operation mode, and drives the word lines of an unselected block using a first bias voltage. The string selection line driver drives a string selection signal of the selected block using a string selection drive voltage according to the operation mode, and drives the string selection signal of the unselected block using a second bias voltage.

The first bias voltage may be a power voltage and the second bias voltage may be a ground voltage.

The word line driver may include a drive unit, a switching unit, and a bias circuit unit. The drive unit generates the word line drive voltages as at least one of a program voltage, a read voltage, a pass voltage, and an erase voltage. The switching unit is connected to each of the blocks, and transfers the at least one of the program voltage, the read voltage, the pass voltage, and the erase voltage to the word line drive signals, in response to a block enable signal. The bias circuit unit is connected to each of the blocks, and drives the word line drive signals of the unselected block using the first bias voltage in response to a block erase signal during an erase operation.

The switching unit may include a high voltage NMOS transistor which transfers the at least one of the program voltage, the read voltage, the pass voltage, and the erase voltage to the word line drive signals in response to the block enable signal. The bias circuit unit may include a PMOS transistor having a source connected to the first bias voltage and a gate connected to the block erase signal; and a high voltage NMOS depletion transistor having a source connected to a drain of the PMOS transistor, a gate connected to an inverse signal of the block erase signal, and a drain connected to the word line drive signal.

The string selection line driver may include a drive unit and a circuit unit. The drive unit drives the string selection signal of the selected block using a power voltage during a program operation and using a read voltage during a read operation. The bias circuit unit drives the string selection signal using a ground voltage in response to a block enable signal of the unselected block.

The bias circuit unit may include an OR gate receiving a ground bias control signal and the block enable signal of the unselected block; and a high voltage NMOS transistor connected between the string selection signal and the ground voltage and having a gate connected to an output of the OR gate.

The row decoder may further include a ground selection line driver which drives a ground selection signal of the selected block using a ground selection drive voltage according to the operation mode, and drives a ground selection signal of the unselected block using a third bias voltage. The third bias voltage may be a ground voltage.

The ground selection line driver may include a drive unit and a bias circuit unit. The drive unit drives the ground selection signal of the selected block using a ground voltage during a program operation and using a read voltage during a read operation. The bias circuit unit drives the ground selection signal using the ground voltage in response to a block enable signal of the unselected block.

The bias circuit unit may include an OR gate receiving a ground bias control signal and a block enable signal of the unselected block; and a high voltage NMOS transistor connected between the ground selection signal and the ground voltage and having a gate connected to an output of the OR gate.

The row decoder may further include a string selection line ground switching unit which is provided for each block and applies a string selection line ground voltage to string selection lines of the blocks in response to the block selection signal.

The string selection line ground switching unit may include multiple high voltage NMOS transistors, each having a source connected to the string selection line ground voltage, a gate connected to the block selection signal, and a drain connected to the string selection line of each of the blocks. The high voltage NMOS transistors may be turned on when the row decoder is unselected and turned off when the row decoder is selected, according to the block address signal.

According to another aspect of the present invention, a flash memory device includes a mat and a row decoder. The mat includes multiple word lines, multiple bit lines, and multiple blocks that share the bit lines. In each block, multiple memory cells serially connected to one of the bit lines constitute a string, multiple memory cells connected to one of the word lines constitute a page, and multiple pages constitute the block. The row decoder is shared by the blocks in the mat, and includes a block decoder, a block word line boosting circuit, a word line driver and string selection line drivers. The block decoder generates a block selection signal in response to block address signals selecting at least two blocks. The block word line boosting circuit generates a high voltage block word line signal in response to the block selection signal. The word line driver drives multiple word line drive signals driving the word lines of the at least two selected blocks using a word line drive voltage according to an operation mode, and drives the word line drive signals of an unselected block using a first bias voltage. The string selection line drivers each drive a string selection signal of one of the at least two selected blocks using a string selection drive voltage according to the operation mode, and drive a string selection signal of an unselected block using a second bias voltage.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
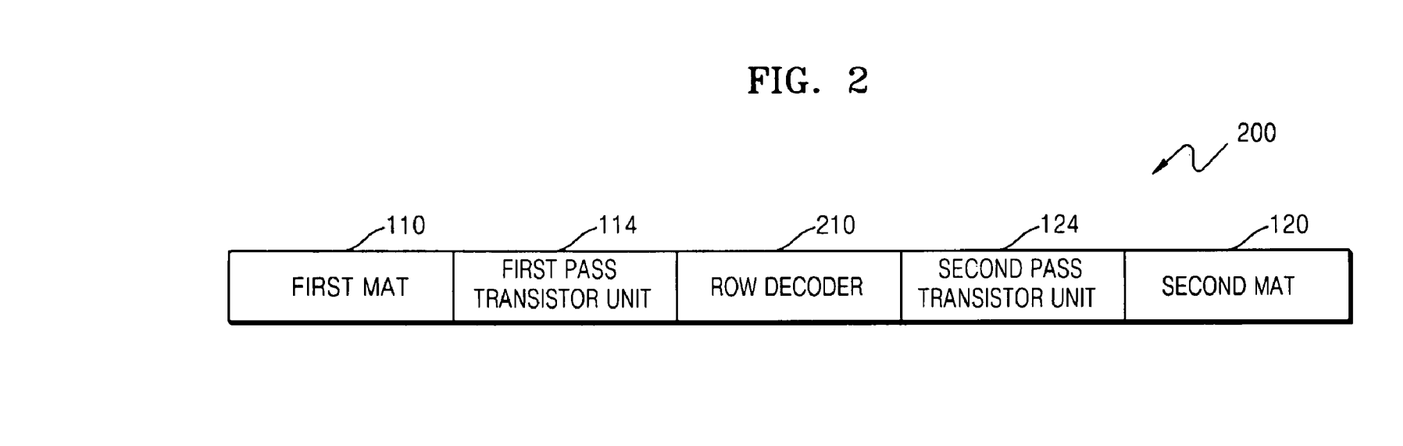
FIG. 2 illustrates a layout of a NAND flash memory device, according to an illustrative embodiment of the present invention.

FIG. 2 illustrates a layout of a NAND flash memory device 200, according to an illustrative embodiment of the present invention. Referring to FIG. 2, the NAND flash memory device 200 includes a row decoder 210 that is shared by at least two mats 110 and 120. The row decoder 210 is located close to and shared by both the first mat 110 and the second mat 120. A first pass transistor 114 is arranged between the first mat 110 and the row decoder 210 and a second pass transistor 124 is arranged between the second mat 120 and the row decoder 210.

Figure 3:
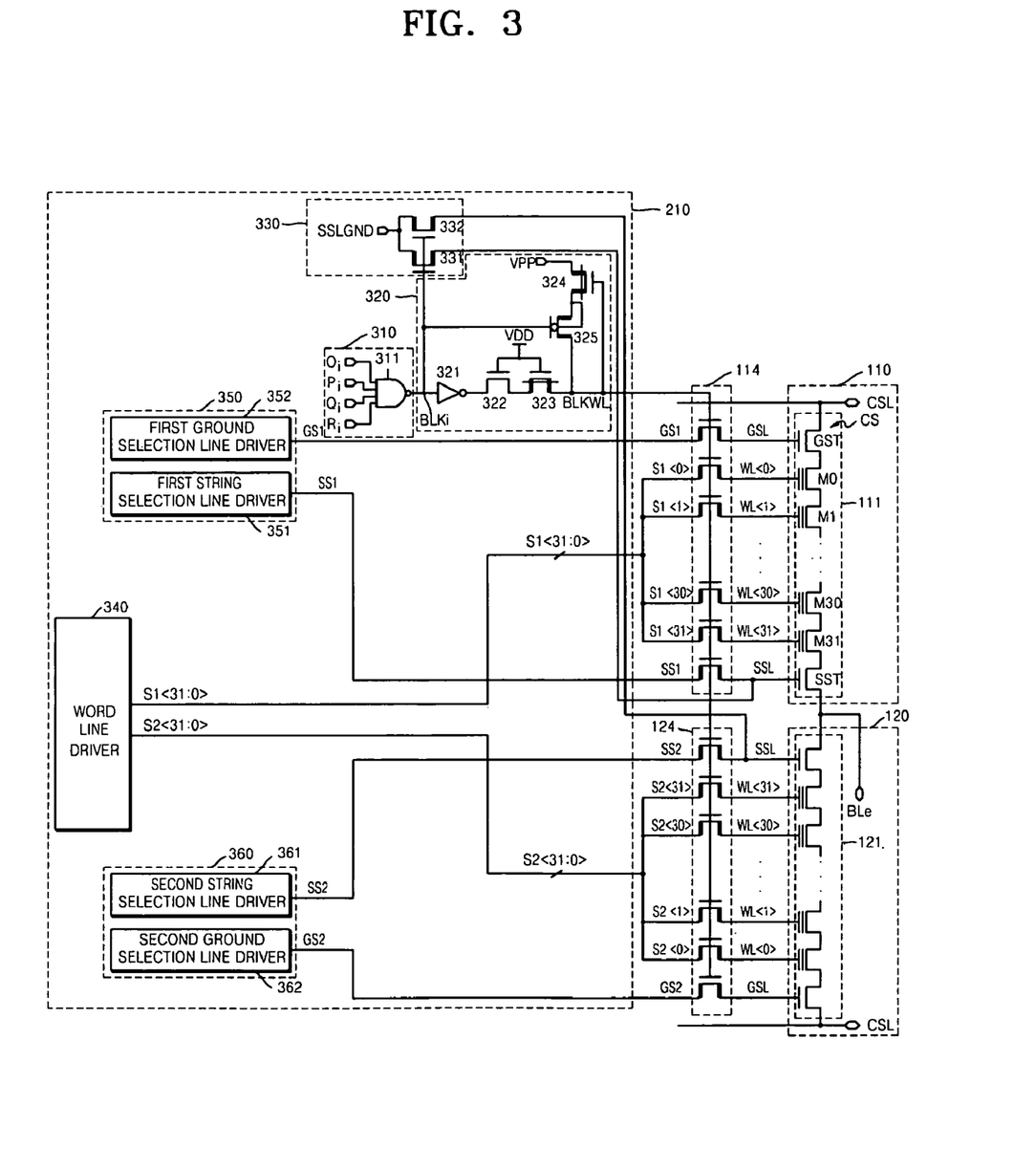
FIG. 3 is a circuit diagram of the NAND flash memory device of FIG. 2, according to an illustrative embodiment of the present invention.

FIG. 3 is a circuit diagram of the NAND flash memory device of FIG. 2, according to an illustrative embodiment. Referring to FIG. 3, a row decoder 210 includes a block decoder 310, a block word line boosting circuit 320, a string selection line ground switching unit 330, a word line driver 340, string selection line drivers 351 and 361, and ground selection line drivers 352 and 362.

The block decoder 310 decodes a mat selection signal Oi and block address signals Pi/Qi/Ri, and generates a block selection signal BLKi. The block decoder 310 includes an AND gate 311, which receives the mat selection signal Oi and the block address signals Pi/Qi/Ri and outputs the block selection signal BLKi.

The block word line boosting circuit 320 generates a block word line signal BLKWL of a high voltage VPP in response to the block selection signal BLKi. In the block word line boosting circuit 320, the block selection signal BLKi is input to an inverter 321 and the output of the inverter 321 passes through an NMOS transistor 322 and a first high voltage NMOS depletion transistor 323 to be output as the block word line signal BLKWL. The gates of the NMOS transistor 322 and the first high voltage NMOS depletion transistor 323 are connected to a power voltage VDD, and the inverter 321 is driven by the power voltage VDD. The block word line boosting circuit 320 further includes a second high voltage NMOS depletion transistor 324 and a high voltage PMOS transistor 325 which are serially connected between the high voltage VPP and the block word line signal BLKWL. The gate of the second high voltage NMOS depletion transistor 324 is connected to the block word line signal BLKWL and the gate of the high voltage PMOS transistor 325 is connected to the block selection signal BLKi.

The string selection line ground switching unit 330 applies a string selection line ground voltage SSLGND to a string selection line SSL in response to the block selection signal BLKi. The string selection line ground voltage SSLGND has a ground voltage VSS level. The string selection line ground switching unit 330 includes, for example, a first high voltage NMOS transistor 331 connected between the string selection line ground voltage SSLGND and the string selection line SSL of a block 111 (hereinafter, referred to as the first block 111) from the first mat 110 and a second high voltage NMOS transistor 332 connected between the string selection line ground voltage SSLGND and the string selection line SSL of a block 121 (hereinafter, referred to as the second block 121) from the second mat 120. The gates of the first and second high NMOS transistors 331 and 332 are connected to the block selection signal BLKi. The string selection line ground switching unit 330 includes the first and second high voltage NMOS transistors 331 and 332 connected to the string selection line SSL of each of the first and second blocks 111 and 121. For example, each of the high voltage NMOS transistors 331 and 332 may have a source connected to the string selection line ground voltage SSLGND and a drain connected to the string selection line LLS of each of the blocks. This prevents the second block 121, which is not selected for purposes of illustration, from being affected while the first block 111, which is selected for purposes of illustration, performs a program operation or a read operation.

The word line driver 340 drives word line drive signals S1<31:0> of the first block 111 using a program voltage Vpgm, an erase voltage Verase, a read voltage Vread, or a pass voltage Vpass according to an operation mode, and/or word line drive signals S2<31:0> of the second block 121 using the program voltage Vpgm, the erase voltage Verase, the read voltage Vread, or the pass voltage Vpass according to an operation mode, in response to control signals (not shown) and decoded row address signals (not shown), according to a program operation, an erase operation, or a read operation, respectively.

The string selection line drivers 351 and 361 respectively drive a string selection signal SS1 of the first block 111 and a string selection signal SS2 of the second block 121 using the read voltage Vread or the power voltage VDD according to the operation mode. Also, the ground selection line drivers 352 and 362 respectively drive a ground selection signal GS1 of the first block 111 and a ground selection signal GS2 of the second block 121 using the read voltage Vread or the ground voltage VSS according to the operation mode.

The first pass transistor unit 114 transfers a first string selection signal SS1, the word line drive signals S1<31:0>, and the first ground selection signal GS1 to the string selection line SSL, the word lines WL<31:0> and the ground selection line GSL of the first block 111, respectively, in response to the block word line signal BLKWL. The second pass transistor unit 124 transfers a second string selection signal SS2, the word line drive signals S2<31:0>, and the second ground selection signal GS2 to the string selection line SSL, the word lines WL<31:0> and the ground selection line GSL of the second block 121, respectively, in response to the block word line signal BLKWL. Each of the first and second pass transistor units 114 and 124 consists of high voltage NMOS transistors having gates connected to the block word line signal BLKWL.

Each of the first and second blocks 111 and 121 includes a multiple cell strings CS, although only one cell string CS for each block is shown for convenience of description. The respective cell strings CS are commonly connected to a common source line CSL. The gates of representative flash memory cells M0-M31 serially connected to a single bit line BLe, for example, are respectively connected to word lines WL0-WL31. The gates of string selection transistors SST connecting the corresponding cell strings CS to the bit line BLe are connected to the string selection lines SSL. The gates of ground selection transistors GST connecting the corresponding cell strings CS to the common source line CSL are connected to the ground selection lines GSL. Although FIG. 3 illustrates the two blocks 111 and 121 sharing the bit line BLe, it is understood that multiple additional blocks sharing the bit lines may be further provided.

Figure 4:
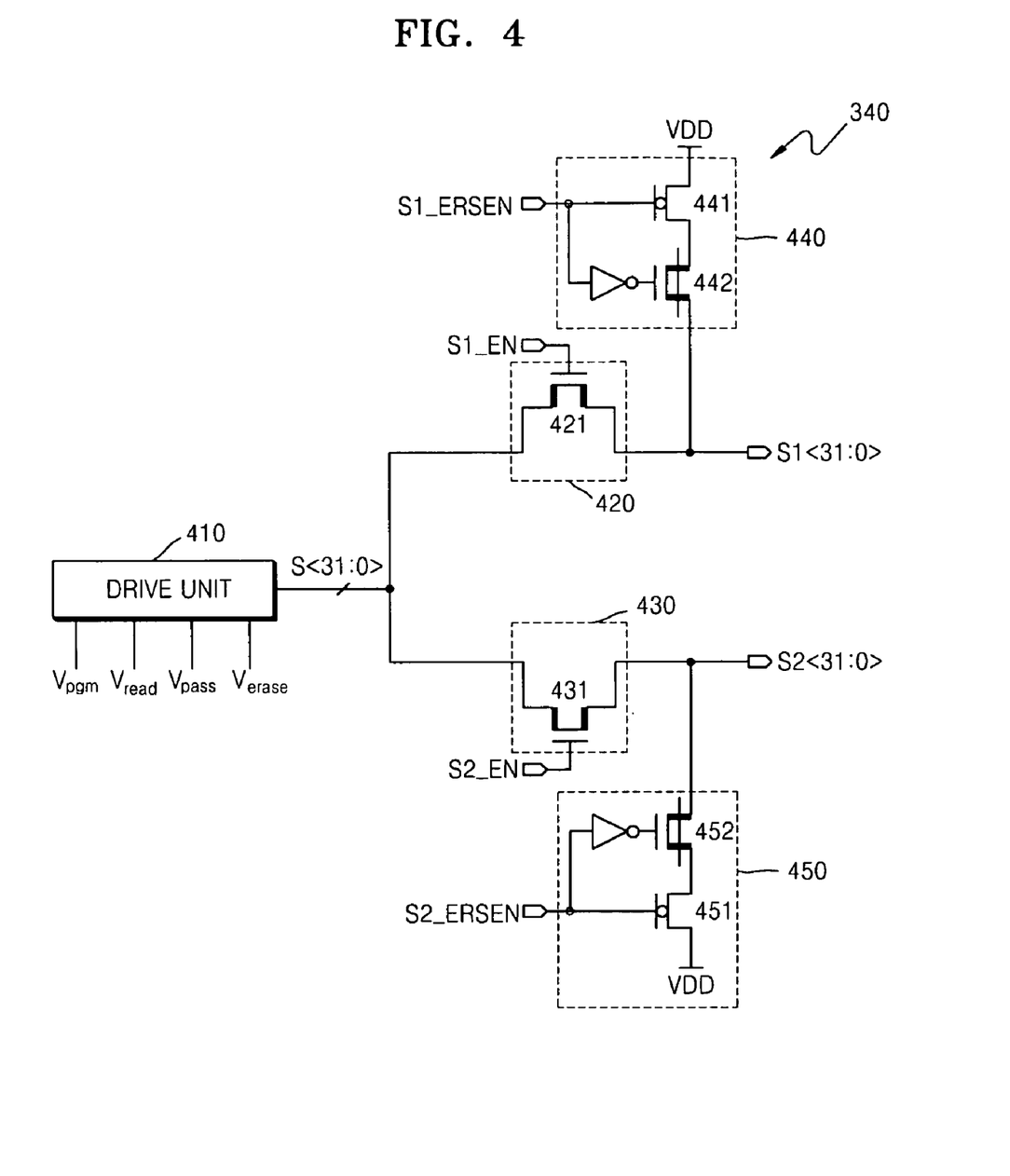
FIG. 4 is a circuit diagram of a word line driver of FIG. 3.

FIG. 4 is a circuit diagram of the word line driver 340 of FIG. 3, according to an illustrative embodiment. Referring to FIG. 4, the word line driver 340 includes a drive unit 410, a first switching unit 420, a second switching unit 430, a first bias circuit unit 440, and a second bias circuit unit 450. The drive unit 410 generates, as drive signals S<31:0>, the program voltage Vpgm, the read voltage Vread, the pass voltage Vpass, and the erase voltage Verase provided by a high voltage generation circuit (not shown), according to the control of a write/read controller (not shown) of the NAND flash memory device 200 of FIG. 2.

The first switching unit 420 transfers the drive signals S<31:0> to first word line drive signals S1<31:0>, in response to a first block enable signal S1_EN. The first block enable signal S1_EN is a signal for selecting the first block 111. The first switching unit 420 includes a pass transistor 421 that transfers the drive signals S<31:0> of the program voltage Vpgm, the read voltage Vread, the pass voltage Vpass or the erase voltage Verase, to the first word line drive signals S1<31:0>, in response to the first block enable signal S1_EN. The pass transistor 421 may be a high voltage NMOS transistor, for example.

The second switching unit 430 transfers the drive signals S<31:0> to second word line drive signals S2<31:0>, in response to a second block enable signal S2_EN. The second block enable signal S2_EN is a signal for selecting the second block 121. The second switching unit 430 includes a pass transistor 431 that transfers the drive signals S<31:0> of the program voltage Vpgm, the read voltage Vread, the pass voltage Vpass or the erase voltage Verase, to the second word line drive signals S2<31:0>, in response to the second block enable signal S2_EN. The pass transistor 431 may be a high voltage NMOS transistor, for example.

The first bias circuit unit 440 applies the first word line drive signals S1<31:0> as a level of the power voltage VDD when the first block 111 is not selected during the erase operation. The first bias circuit unit 440 includes a PMOS transistor 441 and a high voltage NMOS depletion transistor 442, which are serially connected between the power voltage VDD and the first word line drive signals S1<31:0>. The gate of the PMOS transistor 441 is connected to a first block erase signal S1_ERSEN. The gate of the high voltage NMOS transistor 442 is connected to an inverse signal of the first block erase signal S1_ERSEN. Also, in an embodiment, a source of the PMOS transistor 441 may be connected to the power voltage VDD, a source of high voltage NMOS depletion transistor 442 may be connected to a drain of the PMOS transistor 441, and a drain of high voltage NMOS depletion transistor 442 may be connected to the word line drive signals S1<31:0>.

The second bias circuit unit 450 applies the second word line drive signals S2<31:0> as a level of the power voltage VDD when the second block 121 is not selected during the erase operation. The second bias circuit unit 450 includes a PMOS transistor 451 and a high voltage NMOS depletion transistor 452, which are serially connected between the power voltage VDD and the second word line drive signals S2<31:0>. The gate of the PMOS transistor 451 is connected to a second block erase signal S2_ERSEN. The gate of the high voltage NMOS transistor 452 is connected to an inverse signal of the second block erase signal S2_ERSEN. Also, in an embodiment, a source of the PMOS transistor 451 may be connected to the power voltage VDD, a source of high voltage NMOS depletion transistor 452 may be connected to a drain of the PMOS transistor 451, and a drain of high voltage NMOS depletion transistor 452 may be connected to the word line drive signals S2<31:0>.

In the operation of the word line driver 340, when the first block 111 is selected, the word line driver 340 drives the first word line drive signals S1<31:0> using the program voltage Vpgm, the read voltage Vread, the pass voltage Vpass, or the erase voltage Verase according to the operation mode, through the drive unit 410 and the first switching unit 420. The second word line drive signals S2<31:0> of the second block 121, which is not selected, are floated in the program operation mode and the read operation mode. The power voltage VDD is applied by the second bias circuit portion 450 in the erase operation mode.

Likewise, when the second block 121 is selected, the word line driver 340 drives the second word line drive signals S2<31:0> using the program voltage Vpgm, the read voltage Vread, the pass voltage Vpass, or the erase voltage Verase according to the operation mode, through the drive unit 410 and the second switching unit 430. The first word line drive signals S1<31:0> of the first block 111, which is not selected, are floated in the program operation mode and the read operation mode. The power voltage VDD is applied by the first bias circuit portion 440 in the erase operation mode.

Figure 5:
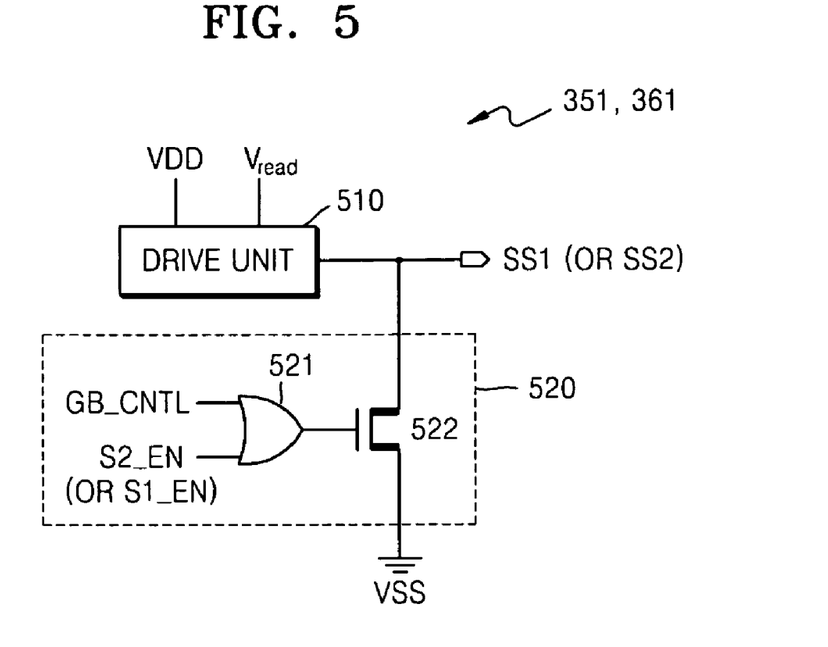
FIG. 5 is a circuit diagram of string selection line drivers of FIG. 3.

FIG. 5 is a circuit diagram of the string selection line drivers 351 and 361 of FIG. 3, according to an illustrative embodiment. Referring to FIG. 5, the first string selection line driver 351 includes a drive unit 510 and a bias circuit unit 520. When the first block 111 is selected, the drive unit 510 drives the first string selection signal SS1 using the power voltage VDD during the program operation and using the read voltage Vread during the read operation. When the first block 111 is not selected, the bias circuit unit 520 drives the first string selection signal SS1 using the ground voltage VSS. The bias circuit unit 520 includes a logic circuit 521 and a high voltage NMOS transistor 522. The logic circuit 521 may be an OR gate, which receives a ground bias control signal GB_CNTL and the second block enable signal S2_EN, for example. The high voltage NMOS transistor 522 drives the first string selection signal SS1 using the ground voltage VSS in response to the output of the logic circuit 521.

The second string selection line driver 361 has the same structure as that of the first string selection line driver 351, except that the logic circuit 521 of the bias circuit unit 520 may be an OR gate receiving the ground bias control signal GB_CNTL and the first block enable signal S1_EN, for example. When the second block 121 is selected, the second string selection line driver 361 drives the second string selection signal SS2 using the power voltage VDD and the read voltage Vread according to the operation mode. When the second block 121 is not selected, the second string selection line driver 361 drives the second string selection signal SS2 using the ground voltage VSS.

Figure 6:
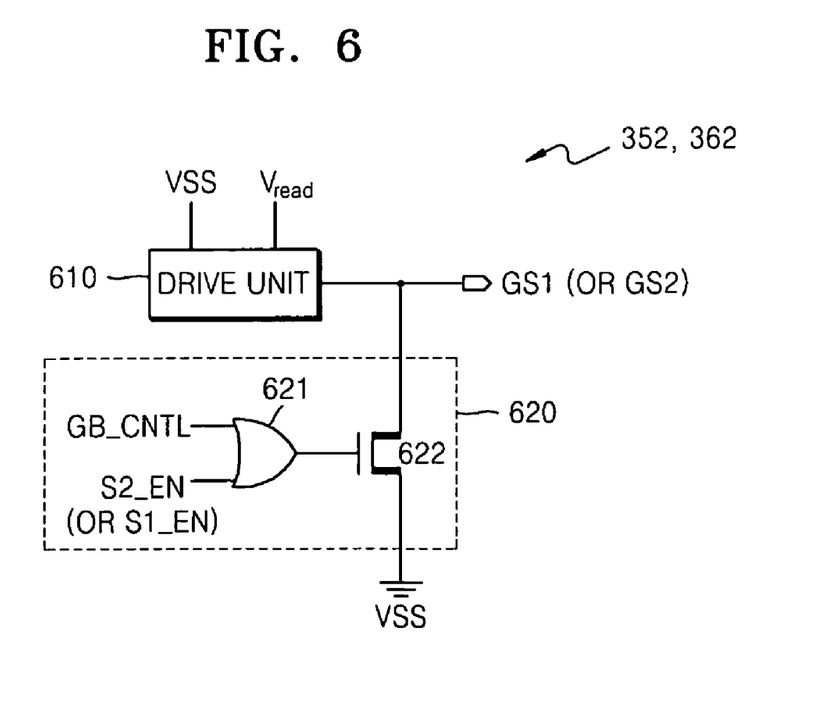
FIG. 6 is a circuit diagram of ground selection line drivers of FIG. 3.

FIG. 6 is a circuit diagram of the ground selection line drivers 352 and 362 of FIG. 3, according to an illustrative embodiment. Referring to FIG. 6, the first ground selection line driver 352 includes a drive unit 610 and a bias circuit unit 620. When the first block 111 is selected, the drive unit 610 drives the first ground selection signal GS1 using the ground voltage VSS during the program operation and using the read voltage Vread during the read operation. When the first block 111 is not selected, the bias circuit unit 620 drives the first ground selection signal GS1 using the ground voltage VSS. The bias circuit unit 620 includes a logic circuit 621 and a high voltage NMOS transistor 622. The logic circuit 621 may be an OR gate, which receives the ground bias control signal GB_CNTL and the second block enable signal S2_EN, for example. The high voltage NMOS transistor 622 drives the first ground selection signal GS1 using the ground voltage VSS in response to the output of the logic circuit 621.

The second ground selection line driver 362 has the same structure as that of the first ground selection line driver 352, except that the logic circuit 621 of the bias circuit unit 620 may be an OR gate, which receives the ground bias control signal GB_CNTL and the first block enable signal S1_EN, for example. When the second block 121 is selected, the second ground selection line driver 362 drives the second ground selection signal GS2 using the ground voltage VSS and the read voltage Vread according to the operation mode. When the second block 121 is not selected, the second ground selection line driver 362 drives the second ground selection signal GS2 using the ground voltage VSS.

The operation of the NAND flash memory device 200 having the row decoder 210 according to the illustrative embodiment is summarized in Table 1, when the first word line WL0 of the first block 111, for example, is selected.

TABLE 1

| | Signal | Program Operation | Read Operation | Erase Operation |
|---|---|---|---|---|
| Selected Word Line | S1<0> | Vpgm | Vread | Verase |
| Unselected Word Line | S1<31:0> | Vpass | Vread | Verase |
| | S2<31:0> | Floating | Floating | Vdd |
| BLKWL | — | VPP | VPP | Vdd |
| SSL | SS1 | Vdd | Vread | Floating |
| | SS2 | 0 | 0 | Floating |
| GSL | GS1 | 0 | Vread | Floating |
| | GS2 | 0 | 0 | Floating |

Thus, in the flash memory device according to the present embodiment, since the row decoder 210 is shared by the at least two mats 110 and 120, the chip layout size can be reduced, as compared to the chip layout size of a flash memory device which has a row decoder for each mat. In particular, the row decoder 210 can further reduce the chip layout size and/or layout area of the row decoder because the block word line signal BLKWL of the high voltage VPP is generated by the block word line boosting circuit 320 shared by the mats 110 and 120. For example, when the first block 111 is selected and performs a program operation or a read operation, the second string selection signal SS2 and the second ground selection signal GS2 of the second block 121, which is not selected, are biased to the ground voltage VSS. Accordingly, the second block 121 sharing the row decoder 210 is not affected by the program operation or the read operation of the first block 111.

Although the NAND flash memory device 200 of the present embodiment illustrates an example in which the row decoder 210 is shared by at least two mats 110 and 120, the various embodiments of the present invention are not limited thereto. For example, the row decoder 210 can be shared by at least two blocks in the same mat 110 or 120. In this case, the first block 111 and the second block 121 belong to either the mat 110 or the mat 120. The first pass transistor unit 114 is arranged between the first block 111 and the row decoder 210 and the second pass transistor unit 124 is arranged between the second block 121 and the row decoder 210.

As described above, according to the flash memory device of the present invention, since a single row decoder is shared by at least two mats, the layout area can be decreased compared to the prior art in which a row decoder is provided for each mat. Also, the row decoder may be shared by blocks in the same mat. Since the row decoder generates a high voltage block word line signal using the block word line boosting circuit that is shared by the blocks in the mats or in the same block, the chip layout area can be further decreased. While the selected block performs the program or read operations, the string selection signal of the unselected blocks and the ground selection signal are biased to a ground voltage. Accordingly, the unselected blocks are not influenced by the program or read operations of the selected block.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device, comprising:
   at least two mats, each mat comprising a plurality of word lines, a plurality of bit lines, and a plurality of blocks that share the plurality of bit lines, where in each block, a plurality of memory cells serially connected to one of the bit lines constitute a string, a plurality of memory cells connected to one of the word lines constitute a page, and a plurality of the pages constitute the block; and
   a row decoder shared by the plurality of blocks of each of the at least two mats, wherein the row decoder comprises:
      a block decoder generating a block selection signal in response to a block address signal for selecting a block of the plurality of blocks;
      a block word line boosting circuit generating a high voltage block word line signal in response to the block selection signal;
      a word line driver driving a plurality of word line drive signals driving the word lines of the selected block using word line drive voltages according to an operation mode, and driving the word lines of an unselected block using a first bias voltage; and
      a string selection line driver driving a string selection signal of the selected block using a string selection drive voltage according to the operation mode, and for driving the string selection signal of the unselected block using a second bias voltage.

2. The flash memory device of claim 1, wherein the first bias voltage is a power voltage.

3. The flash memory device of claim 1, wherein the second bias voltage is a ground voltage.

4. The flash memory device of claim 1, wherein the word line driver comprises:
   a drive unit generating the word line drive voltages as at least one of a program voltage, a read voltage, a pass voltage, and an erase voltage;
   a switching unit connected to each of the blocks and transferring the at least one of the program voltage, the read voltage, the pass voltage, and the erase voltage to the word line drive signals, in response to a block enable signal; and
   a bias circuit unit connected to each of the blocks and driving the word line drive signals of the unselected block using the first bias voltage in response to a block erase signal during an erase operation.

5. The flash memory device of claim 4, wherein the switching unit comprises a high voltage NMOS transistor which transfers the at least one of the program voltage, the read voltage, the pass voltage, and the erase voltage to the word line drive signals in response to the block enable signal.

6. The flash memory device of claim 4, wherein the bias circuit unit comprises:
   a PMOS transistor having a source connected to the first bias voltage and a gate connected to the block erase signal; and
   a high voltage NMOS depletion transistor having a source connected to a drain of the PMOS transistor, a gate connected to an inverse signal of the block erase signal, and a drain connected to the word line drive signal.

7. The flash memory device of claim 1, wherein the string selection line driver comprises:
   a drive unit driving the string selection signal of the selected block using a power voltage during a program operation and using a read voltage during a read operation; and
   a bias circuit unit driving the string selection signal using a ground voltage in response to a block enable signal of the unselected block.

8. The flash memory device of claim 7, wherein the bias circuit unit comprises:
   an OR gate receiving a ground bias control signal and the block enable signal of the unselected block; and
   a high voltage NMOS transistor connected between the string selection signal and the ground voltage and having a gate connected to an output of the OR gate.

9. The flash memory device of claim 1, wherein the row decoder further comprises:
   a ground selection line driver which drives a ground selection signal of the selected block using a ground selection drive voltage according to the operation mode, and drives a ground selection signal of the unselected block using a third bias voltage.

10. The flash memory device of claim 9, wherein the third bias voltage is a ground voltage.

11. The flash memory device of claim 9, wherein the ground selection line driver comprises:
    a drive unit driving the ground selection signal of the selected block using a ground voltage during a program operation and using a read voltage during a read operation; and
    a bias circuit unit driving the ground selection signal using the ground voltage in response to a block enable signal of the unselected block.

12. The flash memory device of claim 11, wherein the bias circuit unit comprises:
    an OR gate receiving a ground bias control signal and a block enable signal of the unselected block; and
    a high voltage NMOS transistor connected between the ground selection signal and the ground voltage and having a gate connected to an output of the OR gate.

13. The flash memory device of claim 1, wherein the row decoder further comprises:
    a string selection line ground switching unit which is provided for each block and applies a string selection line ground voltage to string selection lines of the blocks in response to the block selection signal.

14. The flash memory device of claim 13, wherein the string selection line ground switching unit comprises:

a plurality of high voltage NMOS transistors, each having a source connected to the string selection line ground voltage, a gate connected to the block selection signal, and a drain connected to the string selection line of each of the blocks, wherein the high voltage NMOS transistors are turned on when the row decoder is unselected and turned off when the row decoder is selected, according to the block address signal.

15. A flash memory device comprises:

a mat comprising a plurality of word lines, a plurality of bit lines, and a plurality of blocks that share the plurality of bit lines, where in each block, a plurality of memory cells serially connected to one of the bit lines constitute a string, a plurality of memory cells connected to one of the word lines constitute a page, and a plurality of the pages constitute the block; and a row decoder shared by the blocks in the mat, wherein the row decoder comprises:

a block decoder generating a block selection signal in response to block address signals selecting at least two blocks;

a block word line boosting circuit generating a high voltage block word line signal in response to the block selection signal;

a word line driver driving a plurality of word line drive signals driving the word lines of the at least two selected blocks using a word line drive voltage according to an operation mode, and driving the word line drive signals of an unselected block using a first bias voltage; and string selection line drivers each driving a string selection signal of one of the at least two selected blocks using a string selection drive voltage according to the operation mode, and driving a string selection signal of an unselected block using a second bias voltage.

16. The flash memory device of claim 15, wherein the first bias voltage is a power voltage.

17. The flash memory device of claim 15, wherein the second bias voltage is a ground voltage.

18. The flash memory device of claim 15, wherein the word line driver comprises:

a drive unit generating the word line drive voltages as at least one of a program voltage, a read voltage, a pass voltage, and an erase voltage;

a switching unit connected to each of the blocks and transferring the at least one of the program voltage, the read voltage, the pass voltage, and the erase voltage to the word line drive signals, in response to a block enable signal; and a bias circuit unit connected to each of the blocks and driving the word line drive signals of the unselected block using the first bias voltage in response to a block erase signal during an erase operation.

19. The flash memory device of claim 18, wherein the switching unit comprises a high voltage NMOS transistor which transfers the drive signals of the one of the program voltage, the read voltage, the pass voltage, or the erase voltage to the word line drive signals in response to the block enable signal.

20. The flash memory device of claim 18, wherein the bias circuit unit comprises:

a PMOS transistor having a source connected to the first bias voltage and a gate connected to the block erase signal; and a high voltage NMOS depletion transistor having a source connected to a drain of the PMOS transistor, a gate connected to an inverse signal of the block erase signal, and a drain connected to the word line drive signal.

21. The flash memory device of claim 15, wherein each string selection line driver comprises:

a drive unit driving the string selection signal of the selected block using a power voltage during a program operation and using a read voltage during a read operation; and a bias circuit unit driving the string selection signal using a ground voltage in response to a block enable signal of the unselected block.

22. The flash memory device of claim 21, wherein the bias circuit unit comprises:

an OR gate receiving a ground bias control signal and the block enable signal of the unselected block; and a high voltage NMOS transistor connected between the string selection signal and the ground voltage and having a gate connected to an output of the OR gate.

23. The flash memory device of claim 15, wherein the row decoder further comprises:

ground selection line drivers each of which drives a ground selection signal of one of the at least two selected blocks using a ground selection drive voltage according to the operation mode, and drives a ground selection signal of the unselected block using a third bias voltage.

24. The flash memory device of claim 23, wherein the third bias voltage is a ground voltage.

25. The flash memory device of claim 23, wherein each ground selection line driver comprises:

a drive unit driving the ground selection signal of the selected block using a ground voltage during a program operation and using a read voltage during a read operation; and a bias circuit unit driving the ground selection signal using a ground voltage in response to a block enable signal of the unselected block.

26. The flash memory device of claim 25, wherein the bias circuit unit comprises:

an OR gate receiving a ground bias control signal and the block enable signal of the unselected block; and a high voltage NMOS transistor connected between the ground selection signal and the ground voltage and having a gate connected to an output of the OR gate.

27. The flash memory device of claim 15, wherein the row decoder further comprises:

a string selection line ground switching unit which is provided for each block and applies a string selection line ground voltage to string selection lines of the blocks in response to the block selection signal.

28. The flash memory device of claim 27, wherein the string selection line ground switching unit comprises:

at least two high voltage NMOS transistors, each having a source connected to the string selection line ground voltage, a gate connected to the block selection signal, and a drain connected to the string selection line of each of the blocks, wherein the high voltage NMOS transistors are turned on when the row decoder is unselected and turned off when the row decoder is selected, according to the block address signals.

* * * * *